(12) United States Patent
Lefevre (10) Patent No.: US 10,873,267 B2
(45) Date of Patent: Dec. 22, 2020

(54) THREE-PHASE SWITCHING UNIT (71) Applicant: Commissariat à l'Énergie Atomique et aux Énergies Alternatives, Paris (FR)

(72) Inventor: Guillaume Lefevre, Aix les Bains (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 223 days.

(21) Appl. No.: 15/855,288

(22) Filed: Dec. 27, 2017

(65) Prior Publication Data

US 2018/0191264 A1    Jul. 5, 2018

(30) Foreign Application Priority Data

Dec. 29, 2016    (FR) ...................................... 16 63513

(51) Int. Cl.
*H05K 5/00* (2006.01)
*H02M 7/00* (2006.01)
(Continued)

(52) U.S. Cl.
CPC ....... *H02M 7/003* (2013.01); *H01L 23/49811* (2013.01); *H01L 23/5383* (2013.01); *H01L 23/5386* (2013.01); *H01L 25/07* (2013.01); *H01L 25/072* (2013.01); *H01L 25/115* (2013.01); *H01L 25/18* (2013.01); *H02M 7/537* (2013.01); *H05K 7/1432* (2013.01); *H01L 23/13* (2013.01); *H01L 24/49* (2013.01); *H01L 2224/49175* (2013.01); *H01L 2924/12036* (2013.01); *H01L 2924/13055* (2013.01); *H01L 2924/13091* (2013.01); *H01L 2924/14252* (2013.01); *H01L 2924/15162* (2013.01);
(Continued)

(58) Field of Classification Search
CPC .............. H02M 7/003; H01L 23/49811; H01L 23/5383; H01L 25/07; H01L 25/072; H01L 25/115
See application file for complete search history.

(56) References Cited

U.S. PATENT DOCUMENTS 5,492,842 A * 2/1996 Eytcheson ............ H02M 7/003
29/593
6,018,192 A * 1/2000 Root ....................... H01L 23/34
257/712
(Continued)

FOREIGN PATENT DOCUMENTS

EP    2 367 281 A2    9/2011

OTHER PUBLICATIONS

Preliminary French Search Report for Application No. FR 1663513 dated Sep. 12, 2017.

*Primary Examiner* — Binh B Tran
(74) *Attorney, Agent, or Firm* — Wolf, Greenfield & Sacks, P.C.

(57) ABSTRACT

A three-phase switching unit including three identical switching cells, each including a first switch and a second switch electrically in series, including a substrate having: a first level receiving, on conductive areas, back sides of integrated circuits forming said switches; and at least one second level comprising conductive areas of interconnection of vias between the first and second levels, the conductive areas of the different levels respecting a symmetry of revolution of order 3.

16 Claims, 7 Drawing Sheets

(51) Int. Cl.
  *H05K 7/14*     (2006.01)
  *H01L 25/07*    (2006.01)
  *H01L 23/498*   (2006.01)
  *H01L 23/538*   (2006.01)
  *H01L 25/11*    (2006.01)
  *H01L 25/18*    (2006.01)
  *H02M 7/537*    (2006.01)
  *H05K 1/18*     (2006.01)
  *H01L 23/13*    (2006.01)
  *H01L 23/00*    (2006.01)

(52) U.S. Cl.
  CPC .............. *H01L 2924/19041* (2013.01); *H01L 2924/19105* (2013.01)

(56) References Cited

U.S. PATENT DOCUMENTS 6,501,172 B1    12/2002    Fukada et al.
2013/0336033 A1    12/2013    Hirler et al.

* cited by examiner

THREE-PHASE SWITCHING UNIT

This application claims the priority benefit of French patent application number 16/63513, filed Dec. 29, 2016, the content of which is incorporated herein by reference in its entirety to the maximum extent allowable by law.

BACKGROUND

The present disclosure generally relates to electronic power conversion circuits, and more particularly to the forming of a three-phase current inverter. The present disclosure more particularly relates to the architecture of a static power converter intended for inverter-type applications (DC-AC).

DISCUSSION OF THE RELATED ART

A three-phase two-level DC-to-AC converter (inverter) is generally based on two sets of three (or three sets of two) electronic switches, typically MOS power transistors (MOSFET) associated with diodes.

Voltage inverters, where the transistors are directly series-connected two by two and each transistor is equipped with a diode in antiparallel, can be distinguished from current inverters, where each transistor is series-connected with a diode to form a switch which is bidirectional in terms of voltage and unidirectional in terms of current. The present disclosure more specifically targets current inverters.

In power applications, the transistors and the diodes are generally formed individually in the form of discrete components or bare chips. Each switch with a controlled switching (transistor) or a spontaneous switching (diode) is manufactured in the form of an individual chip based on semiconductor materials and the different chips are then assembled on a substrate (printed circuit board—PCB, direct bond copper—DBC, insulated metal substrate—IMS, etc.) and then electrically connected to carry out the three-phase current inverter function.

There is a need to improve three-phase current inverters, and in particular their spatial architecture.

SUMMARY

An embodiment overcomes all or part of the disadvantages of three-phase current inverters.

An embodiment provides a solution enabling to homogenize the functional stress between the different switches of a three-phase current inverter.

An embodiment provides a solution particularly adapted to the forming of a current inverter.

Thus, an embodiment provides a three-phase switching unit including three identical switching cells, each comprising a first switch and a second switch electrically in series, comprising a substrate having:

a first level receiving, on conductive areas, back sides of integrated circuits forming said switches; and at least one second level comprising conductive areas of interconnection of vias between the first and second levels, the conductive areas of the different levels respecting a symmetry of revolution of order 3.

According to an embodiment, the first level comprises:

three first conductive areas of reception of a back-side conduction terminal of at least one first switch of each cell; and three second conductive areas of reception of wires of connection to a front-side conduction terminal of said first switch.

According to an embodiment, the second level comprises:

three first conductive areas respectively vertically in line with the first switches; and at least one second conductive area vertically in line with the second switches.

According to an embodiment, the first level further comprises:

a third central conductive area of reception of a back-side conduction terminal of the second switches of the three cells; and three fourth conductive areas of reception of wires of connection to a back-side conduction terminal of said second switches.

According to an embodiment, the second level further comprises three third conductive areas, each being connected by vias to a second and to a fourth conductive area of the first level.

According to an embodiment, said third conductive area of the first level is Y-shaped, each branch receiving one of said second switches.

According to an embodiment, the unit is contained within a triangular shape.

According to an embodiment, a third level of the substrate, between the first and second levels, comprises:

first conductive areas vertically in line with each first switch; and a second conductive area extending under the three second switches.

According to an embodiment, a fourth level of the substrate between the second and third levels comprises:

first conductive areas vertically in line with each first switch; and a second conductive area extending under the three second switches.

According to an embodiment, the first conductive areas of the first level receive respective conduction terminals of the second switches, the first level further comprising three third conductive areas of reception of wires of connection to respective front-side conduction terminals of the second switches.

According to an embodiment, the second conductive areas of the first level are each connected, by vias, to one of said first conductive areas of the second level.

According to an embodiment, said first conductive areas of the second level form a hexagonal ring.

According to an embodiment, the unit is contained within a hexagonal shape.

According to an embodiment, said switches are transistors.

According to an embodiment, the substrate is an insulated multilevel metal substrate, preferably on ceramic.

According to an embodiment, the substrate is a multilevel printed circuit.

An embodiment provides a three-phase current inverter, comprising two units.

According to an embodiment, the cells of the two units are electrically connected two by two, the interconnection nodes defining three phase terminals.

The foregoing and other features and advantages will be discussed in detail in the following non-limiting description of specific embodiments in connection with the accompanying drawings.

DETAILED DESCRIPTION

For clarity, only those elements which are useful to the understanding of the described embodiments have been shown and will be detailed. In particular, the control of a power converter based on the described three-phase inverters has not been detailed, the described embodiments being compatible with usual industrial manufacturing processes and control circuits. Further, the structure and the forming of the circuits upstream and downstream of the described three-phase inverters have not been detailed either, the described embodiments being compatible with usual applications of such three-phase inverters. It should be noted that, in the drawings, the structural and/or functional elements common to the different embodiments may be designated with the same reference numerals and may have identical structural, dimensional, and material properties. Unless otherwise specified, expressions "approximately", "substantially", and "in the order of" mean to within 10%, preferably to within 5%, or to within 10°, preferably to within 5°.

Figure 1:
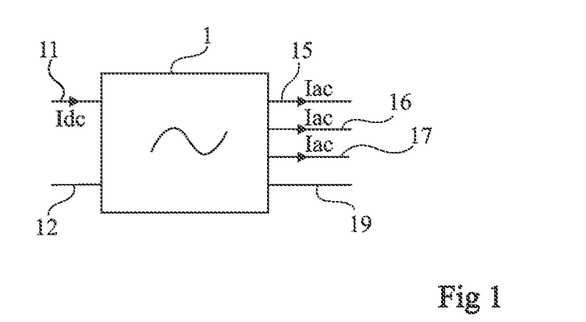
FIG. 1 is a simplified representation in the form of blocks of a three-phase inverter of the type to which the described embodiments apply.

FIG. 1 is a simplified representation in the form of blocks of a three-phase inverter of the type to which the embodiments which will be described apply.

The function of a three-phase inverter 1 is to convert a DC current Idc flowing between two input terminals 11 and 12 into a three-phase AC current Iac on output terminals 15, 16, 17, and 19. Terminals 15, 16, and 17 represent the terminals of the different phases and terminal 19 represents the optional neutral terminal.

Figure 2:
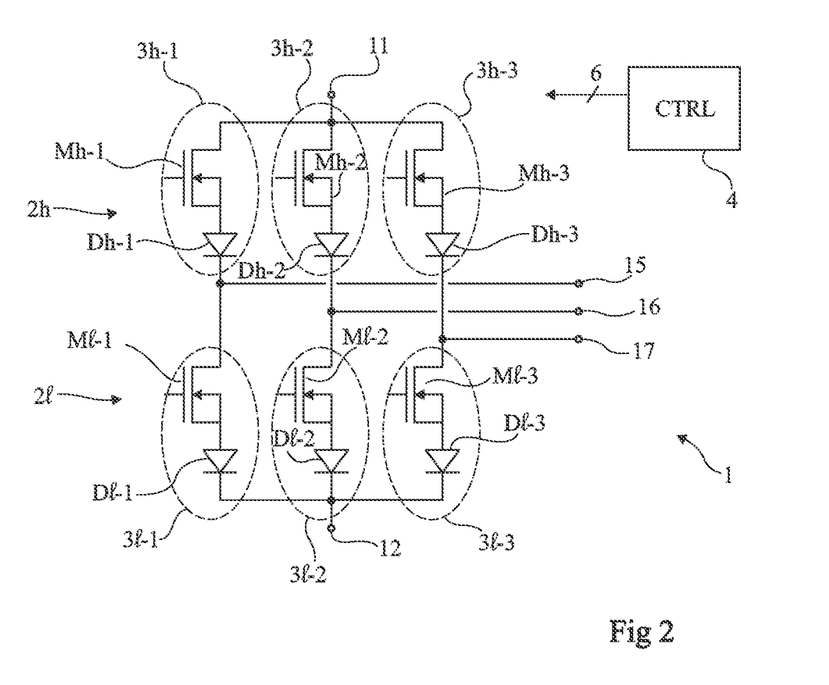
FIG. 2 shows a wiring scheme of a three-phase current inverter.

FIG. 2 shows a wiring scheme of a three-phase current inverter.

Inverter 1 comprises two switching units 2h and 2l having similar inner structures. Each unit 2 comprises three switching cells, cyclically implying two of the three identical switches, respectively 3h-1, 3h-2, 3h-3 and 3l-1, 3l-2, 3l-3, each formed of a MOS transistor (with an N channel) respectively Mh-1, Mh-2, Mh-3, Ml-1, Ml-2, Ml-3, in series with a diode, respectively Dh-1, Dh-2, Dh-3, Dl-1, Dl-2, Dl-3. The drains of transistors Mh-1, Mh-2, and Mh-3 are interconnected to terminal 11 of application of a first potential of current source Idc. The sources of transistors Mh-1, Mh-2, and Mh-3 are respectively connected to the anodes of diodes Dh-1, Dh-2, and Dh-3, having their cathodes respectively connected to terminals 15, 16, and 17 of the three AC voltage phases. The drains of transistors Ml-1, Ml-2, Ml-3 are respectively connected to terminals 15, 16, and 17. The sources of transistors Ml-1, Ml-2, and Ml-3 are respectively connected to the anodes of diodes Dl-1, Dl-2, and Dl-3, having their cathodes interconnected to terminal 12 of application of a second potential of current source Idc.

The gates of transistors Mh-1, Mh-2, Mh-3, Ml-1, Ml-2, Ml-3 are individually connected to a control circuit 4 (CTRL) in charge of organizing the switching of the different cells to generate a three-phase AC current Iac. In a current inverter, the current circulation is successively carried out in each of the switching cells (for example, 3h-1/3h-2, 3h-1/3h-3, 3h-2/3h-3) of a first unit jointly with each of the switching cells (for example, 3l-1/3l-2, 3l-1/3l-3, 3l-2/3l-3) of the other unit. The 9 combinations enabling to generate the three-phase AC current with the appropriate phase shifts are thus obtained. The control of such a current inverter is usual.

In the present description, the high or low unit of the three-phase current inverter containing the element identified by the reference number is identified by letter "h" or "l". Further, the references are completed with "-1", "-2", or "-3" to identify the switching branch (representing the phase of the AC voltage) containing the element identified by the reference number. These reference complements may be omitted when no distinction needs to be made for the needs of the disclosure.

Figure 3:
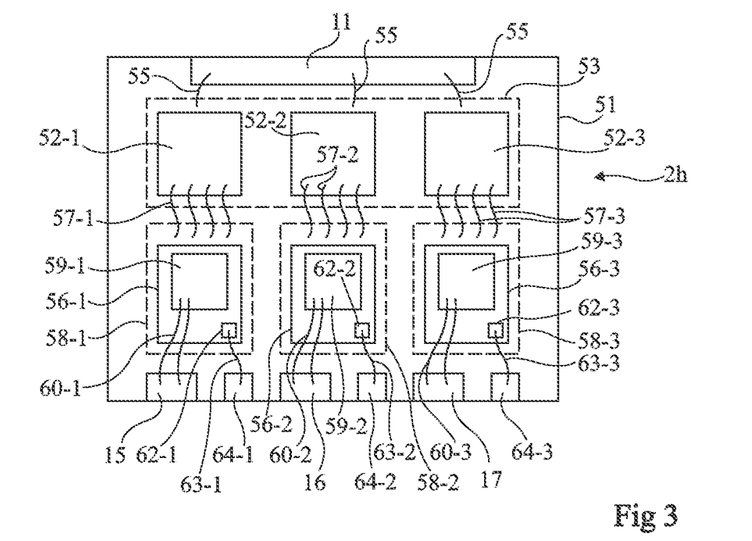
FIG. 3 is a simplified representation of a usual architecture of a switching unit of a three-phase current inverter.

FIG. 3 is a simplified representation of a usual architecture of a switching unit of a three-phase current inverter.

In power applications targeted by the present description, the transistors and diodes are manufactured in the form of vertical components made of semiconductor materials assembled on a plane (printed circuit or metal substrate) 51.

In the example of FIG. 3, a high unit 2h, having its diodes and transistors inverted with respect to FIG. 2, is considered. The anodes of diodes Dh-1, Dh-2, Dh-3 are thus interconnected to terminal 11. The three diodes Dh-1, Dh-2 and Dh-3 are individually formed on P-type substrates and the cathodes are formed by N-type regions in the substrates. The anode electrodes, generally made in the form of a back side metallization of the chips forming diodes Dh-1, Dh-2, Dh-3, are transferred onto a conductive area 53 (typically a metal conductive plane) of a substrate 51, in this example, an insulated metal substrate. A metallization defining terminal 11 is connected to plane 53 by one or a plurality of wires 55. Transistors Mh-1, Mh-2, and Mh-3 are also individually manufactured in the form of chips 56-1, 56-2, and 56-3. The drain electrode of each transistor, generally made in the form of a back-side metallization of the chip, is placed on a conductive area 58-1, 58-2, and 58-3, respectively, of insulated metal substrate 51. The cathode electrodes corresponding to front-side metallizations 52-1, 52-2, and 52-3 of the chips forming diodes Dh-1, Dh-2, and Dh-3 are respectively electrically connected to areas 58-1, 58-2, and 58-3 by one or a plurality of wires 57-1, 57-2, 57-3. The source electrode of each transistor Mh-1, Mh-2, Mh-3 corresponds to a front-side metal contact, respectively 59-1, 59-2, 59-3, connected by one or a plurality of wires 60-1, 60-2, 60-3 to a contact of the insulated metal substrate, defining a terminal, respectively 15, 16, 17. The gates of transistors Mh-1, Mh-2, and Mh-3 are continued on the front side of the chips by contacts 62-1, 62-2 and 62-3, individually connected by one or a plurality of wires 63-1, 63-2, 63-3, to respective contacts of insulated metal substrate 51, defining terminals 64-1, 64-2, 64-3 intended to be connected to control circuit 4 (FIG. 2).

An architecture such as illustrated in FIG. 3 where the chips are placed next to one another generates functional thermal and electrical stress, different according to the operating phases, which adversely affects its reliability.

Further, there is an imbalance between the different conductive meshes, which also adversely affects the operation.

The embodiments which will be described result from a new analysis based on the architecture or the layout of the different switching cells on a substrate comprising metal areas, for example, an insulated metal substrate.

It is in particular provided to make the electrical and thermal stress undergone by the different converter chips identical whatever the phase. Thus, the aging is homogenized, which increases the reliability of current inverters.

More particularly, it is provide to use a multilayer insulated metal substrate (at least two) and to arrange the elements forming each switching cell with, in the plane, a symmetry of revolution of order 3 with respect to the center of the structure. More particularly, the three cells of a unit are arranged in branches of a star- or Y-shaped structure on a first level (arbitrarily called upper level) of the insulated metal substrate where metallized areas are defined and interconnects are formed in at least one second level of the insulated metal substrate where metallized areas are also defined, the connection between metallized areas from one level to another being achieved by conductive vias.

To simplify the representation of the drawings and the following discussion, only the metallized areas of the different levels of the insulated metal substrates have been shown. These areas are of course supported by an insulating support and the different levels are separated by insulating levels.

Figure 4A:
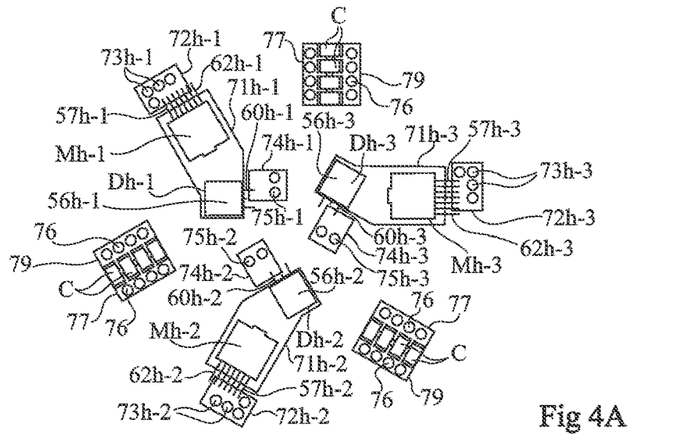
FIG. 4A very schematically shows an embodiment of a first three-phase current inverter unit in a first level of an insulated metal substrate.

FIG. 4A very schematically shows an embodiment of a first three-phase current inverter unit 2h in a first level of an insulated metal substrate.

Figure 4B:
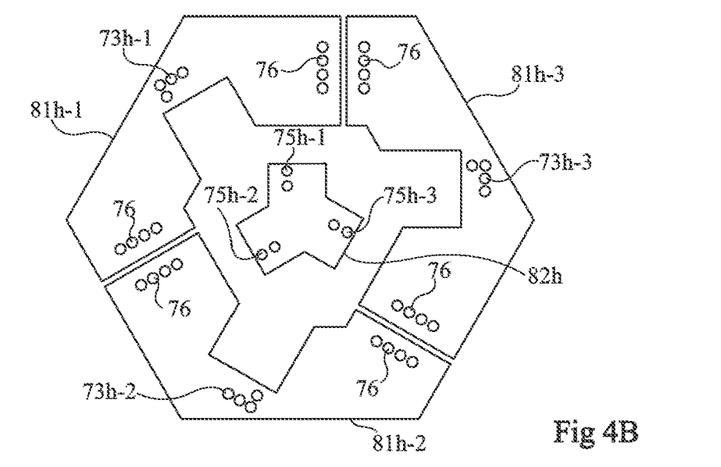
FIG. 4B very schematically shows an embodiment of a second level of the insulated metal substrate of the first unit of FIG. 4A.

FIG. 4B very schematically shows an embodiment of a second level of the insulated metal substrate of the first unit of FIG. 4A.

Figure 4C:
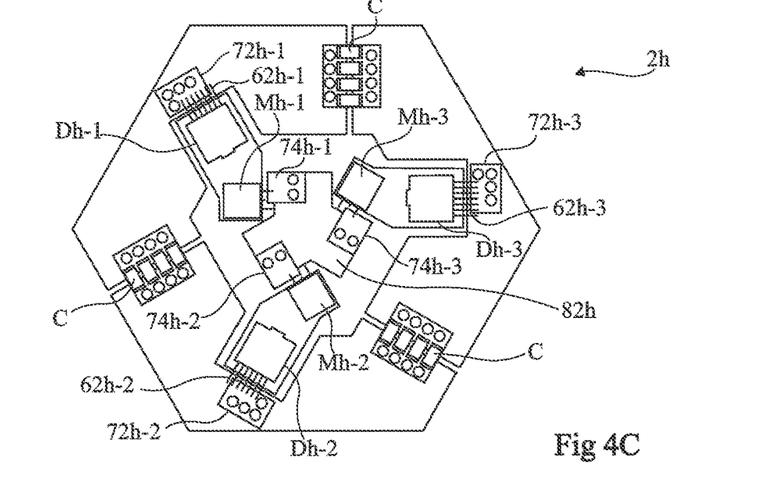
FIG. 4C very schematically shows the two stacked levels, that is, once the unit has been completed.

FIG. 4C very schematically shows the two stacked levels, that is, once unit 2h has been completed.

In the example of FIGS. 4A to 4C, the cell diodes are arranged at the beginning of the branches of the Y (towards the center) and the transistors are arranged towards the free ends of the branches of the Y. Further, a wiring scheme where the respective positions of the diodes and transistors are inverted with respect to the wiring scheme of FIG. 2 is assumed. In other words, in high unit 2h, the anodes of the diodes are interconnected to terminal 11 and the sources of the transistors are connected to respective terminals 15, 16, and 17.

As previously, the diodes and transistors are individually manufactured in the form of discrete chips of vertical components made of semiconductor materials.

In the first level (FIG. 4A), first conductive areas 71h-1, 71h-2, 71h-3 having an approximately rectangular shape of reception of back-side conduction terminals (for example, the drains) of transistors Mh-1, Mh-2, Mh-3 (corresponding to back-side metallizations of the chips forming these transistors) and back-side conduction terminals (for example, the cathodes) of each chip 56h-1, 56h-2, 56h-3, forming respective diodes Dh-1, Dh-2, Dh-3, are formed.

Second conductive areas 72h-1, 72h-2, 72h-3 are formed at the respective outer ends of first areas 71. Areas 72 are each intended to receive one or a plurality of wires 57h-1, 57h-2, 57h-3 of connection of the front-side conduction terminals (for example, the sources) of transistors Mh-1, Mh-2, and Mh-3 (corresponding to front-side metallizations of the chips forming these transistors). Areas 72 are connected, by vias 73h-1, 73h-2, 73h-3, to first areas 81h-1, 81h-2, 81h-3 (FIG. 4B) of the second level of the insulated metal substrate.

Third conductive areas 74h-1, 74h-2, 74h-3 are formed in the central region close to the chips of respective diodes Dh-1, Dh-2, Dh-3. Areas 74 are intended to each receive one or a plurality of wires 60h-1, 60h-2, 60h-3 of connection of the front-side conduction terminals (for example, the anodes) of diodes Dh-1, Dh-2, Dh-3. These anodes are intended to be interconnected (to terminal 11). To achieve this, areas 74 are connected, by vias 75h-1, 75h-2, 75h-3, to a second central area 82-h (FIG. 4B) of the second level of the insulated metal substrate.

Gate contacts 62h-1, 62h-2 and 62-3 of transistors Mh-1, Mh-2, Mh-3 are accessible for a connection, for example, by wires to control circuits which, as will be seen hereafter, are preferably placed nearby.

In the second level (FIG. 4B), the forming of areas 81h and 82h depends on the respective positions of areas of the first level. However, as for the conductive areas of the first level, the conductive areas of the second level respect, in the plane, a symmetry of revolution of order 3 with respect to the center of the structure. In other words, the general structure substantially has a 120° symmetry of revolution.

In the example of FIG. 4B, the second level forms a hexagon. Areas 81 correspond to three identical metallized areas 81h-1, 81h-2, 81h-3, each having the form of a portion of a hexagonal ring-shaped strip, each area being separated from its two neighboring areas. The shape of central area 82h, here approximately forming a star, is vertically in line with the three areas 74h-1, 74h-2, and 74h-3 of the first level. Areas 81h-1, 81h-2, 81h-3 respectively define terminals 15, 16, and 17. Area 82h defines terminal 11.

Such a layout enables to integrate, in the shown example, on the upper surface side, capacitive decoupling elements C electrically connecting terminals 15, 16, and 17 two by two. To achieve this, areas 77 and 79 intended to receive the respective electrodes of capacitors C and connected by vias 76 to the underlying areas 81 are formed in the first level, vertically in line with areas 81.

As a variation, capacitive elements C are directly welded on the second surface of the insulated metal substrate (in this case, areas 77 and 79 are not necessary). The embodiment illustrated in FIGS. 4A to 4C however enables to keep the back side for a heat sink.

Preferably, cutouts of the conductive areas capable of being present are provided in the second level, vertically in line with the diodes and the transistors, to avoid for the chips to be vertically in line with conductive areas of the second level.

Figure 5A:
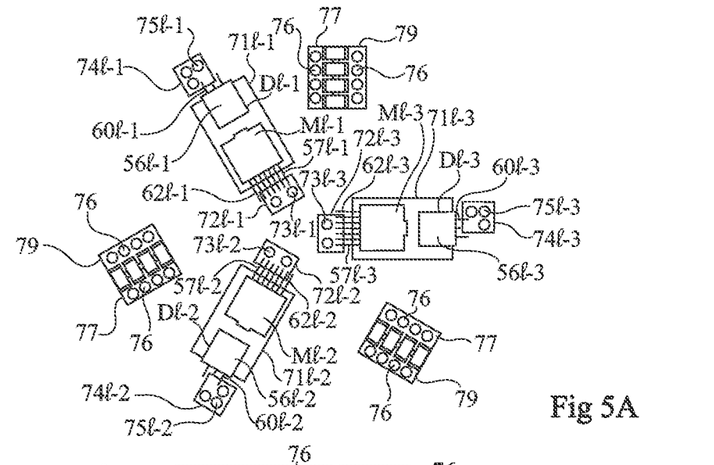
FIG. 5A very schematically shows an embodiment of a second three-phase current inverter unit in a first level of an insulated metal substrate.

FIG. 5A very schematically shows an embodiment of a second three-phase current inverter unit 2*l* in a first level of an insulated metal substrate.

Figure 5B:
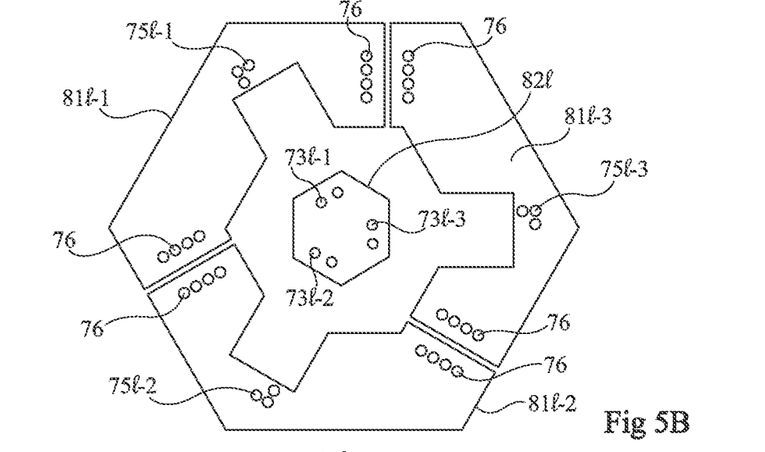
FIG. 5B very schematically shows an embodiment of a second level of the insulated metal substrate of the second unit of FIG. 5A.

FIG. 5B very schematically shows an embodiment of a second level of the insulated metal substrate of the second unit of FIG. 5A.

Figure 5C:
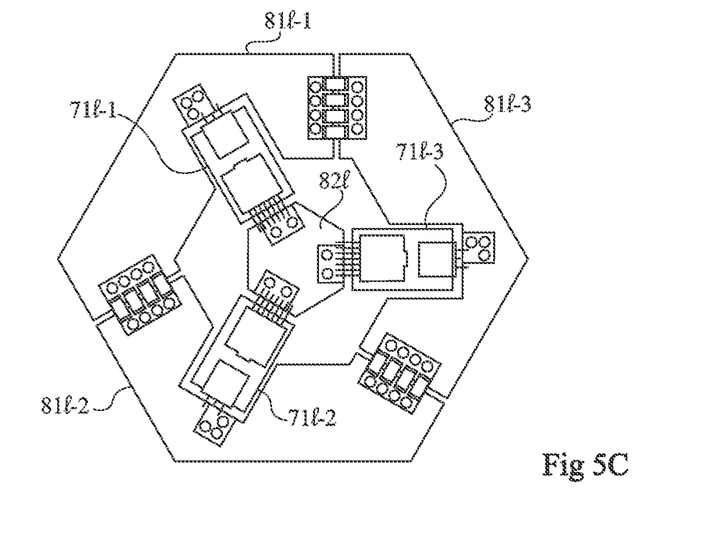
FIG. 5C very schematically shows the two stacked levels, that is, the completed unit.

FIG. 5C very schematically shows the two stacked levels, that is, unit 2*l* completed.

Here, the cell diodes are arranged towards the ends of the branches of the Y and the transistors are arranged towards the center. Here again, a wiring scheme where the respective positions of the diodes and transistors are inverted with respect to the wiring scheme of FIG. 2 is assumed. In other words, in low unit 2*l*, the sources of the transistors are interconnected to terminal 12 and the anodes of the diodes are connected to respective terminals 15, 16, and 17. However, any other layout may be envisaged, provided to respect the symmetry of revolution of approximately 120°. Indeed, the respective positions of the transistors and diodes in each of the units may be inverted.

In the first level (FIG. 5A), first conductive areas 71*l*-1, 71*l*-2, 71*l*-3 having an approximately rectangle shape are formed, to receive the cathode electrodes at the back side of each chip 56*l*-1, 56*l*-2, 56*l*-3 forming diodes Dl-1, Dl-2, Dl-3 and drain contacts of the respective transistors Ml-1, Ml-2, Ml-3.

Second conductive areas 74*l*-1, 74*l*-2, 74*l*-3 are formed at the respective outer ends of first areas 71 close to chips 56*l*-1, 56*l*-2, 56*l*-3 of respective diodes Dl-1, Dl-2, Dl-3. Areas 74 are intended to each receive one or a plurality of wires 60*l*-1, 60*l*-2, 60*l*-3 of connection of the anodes of diodes Dl-1, Dl-2, Dl-3. These anodes are intended to be individually connected to respective terminals 15, 16, and 17. To achieve this, areas 74 are connected, by vias 75*l*-1, 75*l*-2, 75*l*-3, to first areas 81*l*-1, 81*l*-2, 81*l*-3 (FIG. 5B) of the second insulated metal substrate level.

Third conductive areas 72*l*-1, 72*l*-2, 72*l*-3 are formed in the central region close to the chips of respective transistors Ml-1, Ml-2, Ml-3. Areas 72 are intended to each receive one or a plurality of wires 57*l*-1, 57*l*-2, 57*l*-3 of connection of the transistor sources. These sources are intended to be interconnected (to terminal 12). To achieve this, areas 72 are connected, by vias 73*l*-1, 73*l*-2, 73*l*-3, to a second central area 82*l* (FIG. 5B) of the second insulated metal substrate level.

Gate contacts 62*l*-1, 62*l*-2, and 62*l*-3 of transistors Ml-1, Ml-2, Ml-3 are accessible for a connection, for example, by wires to control circuits, which are preferably placed nearby.

In the second level (FIG. 5B), the forming of areas 81 and 82 depends on the respective positions of the areas of the first level. However, here again, as for the conductive areas of the first level, the conductive areas of the second level respect, in the plane, a symmetry of revolution of order 3 with respect to the center of the structure.

In the example of FIG. 5B, areas 81 correspond to three identical metallized areas 81*l*-1, 81*l*-2, 81*l*-3, each having the shape of a portion of a hexagonal ring-shaped strip, each area being separated from its two neighboring areas. Central area 82*l* has a shape, here approximately also hexagonal, vertically in line with the three areas 72*l*-1, 72*l*-2, and 72*l*-3 of the first level. Areas 81*l*-1, 81*l*-2, 81*l*-3 respectively define terminals 15, 16, and 17. Area 82*l* defines terminal 12.

As for unit 2*h*, capacitive decoupling elements C electrically connecting terminals 15, 16, and 17 two by two may be integrated on the upper surface side. To achieve this, respective areas 77 and 79 intended to receive the respective electrodes of capacitors C and connected by vias 76 to the underlying areas 81 are formed in the first level, vertically in line with areas 81. Here again, capacitive elements C may as a variation be directly welded onto the second surface of the insulated metal substrate.

Still as for unit 2*h*, cutouts of the conductive areas capable of being present are preferably provided in the second level, vertically in line with the diodes and the transistors, to avoid for the chips to be vertically in line with conductive areas of the second level.

Figure 6A:
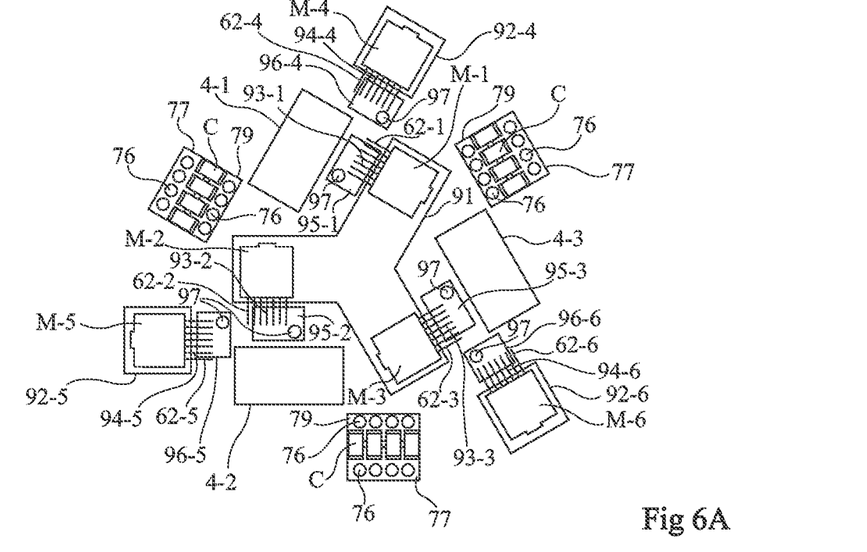
FIG. 6A very schematically shows another embodiment of a first level of an insulated metal substrate where a three-phase current inverter unit is formed.
Figure 6B:
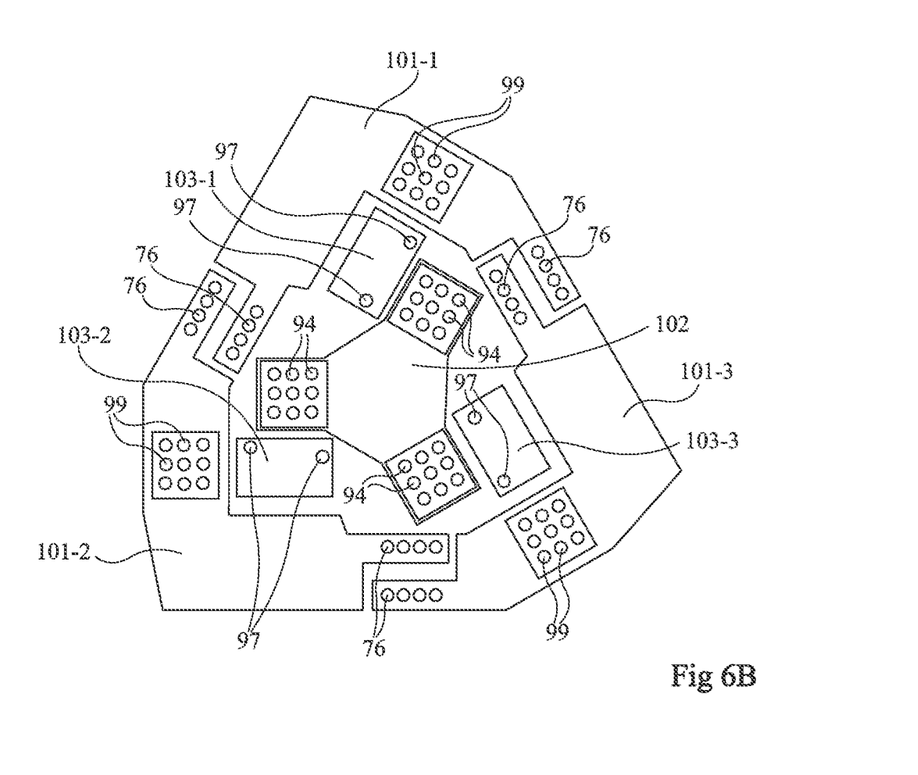
FIG. 6B very schematically shows another embodiment of a second level of an insulated metal substrate having a three-phase current inverter unit according to FIG. 6A formed therein.

FIGS. 6A and 6B schematically show another embodiment of a unit of a three-phase current inverter on a two-level insulated metal substrate.

This embodiment illustrates not only a different layout of the components and of the conductive areas, but also an embodiment where all the switches are transistors. Accordingly, the layout of the conductive areas of FIGS. 6A and 6B may be indifferently used to form a high unit 2*h* or a low unit 2*l* of a three-phase current inverter.

Figure 7:
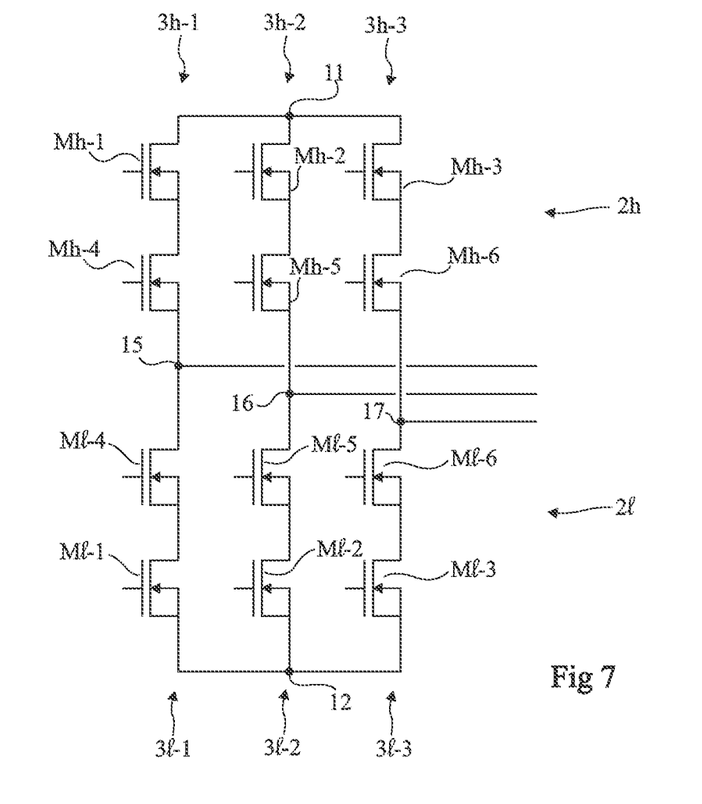
FIG. 7 shows the wiring scheme of a unit where each cell is formed of two series-connected MOS transistors.

FIG. 7 shows the wiring scheme of a unit where each cell is formed of two series-connected MOS transistors.

In this example, the transistors M-1, M-2, M-3 of each cell are interconnected by their respective sources to the source of the other transistor M-4, M-5, M-6 of the cell. The drains of transistors M-1, M-2 and M-3 are interconnected to terminal 11 or 12 according to whether the unit is assembled as a high or low unit, and the drains of transistors M-4, M-5, and M-6 define their respective terminals 15, 16, and 17.

In the first level (FIG. 6A), first conductive areas 92-4, 92-5, 92-6 having an approximately rectangle (or square) shape are formed, to receive back-side contacts (drains) of transistors M-4, M-5, M-6. Back-side drain transistors are here assumed. A third conductive area 91, approximately in the shape of a star or of a Y having each branch (preferably its free end) receiving the back-side (drain) contact of one of transistors M-1, M-2, M-3 is also formed. The centers of the chips of the transistors of a same cell are approximately on a same imaginary radius of a circle connecting the centers of the chips of transistors M-1, M-2, M-3 together and the centers of the chips of transistors M-4, M-5, M-6 together. First areas 92 are connected, by a set of vias 99 arranged under the chip that they receive, to first respective areas 10*l*-1, 10*l*-2, 10*l*-3 of the second level (FIG. 6B), each describing a portion of an approximately triangular ring shape. Third area 91 is connected, by sets of vias 94, arranged under the chips of transistors M-1, M-2, M-3, to a second central area 102, approximately star- or Y-shaped, of the second level.

Second 96-4, 96-5, 96-6 and fourth 95-1, 95-2, 95-3 conductive areas are formed in the first level, close to the first and second areas, respectively, and are intended to each receive one or a plurality of wires 94-4, 94-5, 94-6, respectively 93-1, 93-2, 93-3, of connection of the source contacts of transistors M-4, M-5, M-6, respectively M-1, M-2, M-3. Areas 95 and 96 are connected two by two by vias 97 to three approximately rectangular areas 103-1, 103-2 and 103-3 of the second level. The interconnection of areas 95 and 96 by the second level preserves an easy access to gates 62-1, 62-2, 62-3, 62-4, 62-5, 62-6. As a variation, a specific cutting of areas 95 and 96 and an adapted pattern of the connection tracks (not shown) of the gates to control circuits 4-1, 4-2, 4-3 may be provided to interconnect the sources in the first level.

As for the previous embodiments, capacitive elements C electrically connecting terminals 15, 16, and 17 two by two are integrated on the upper surface side. To achieve this, respective areas 77 and 79 intended to receive the respective electrodes of capacitors C and connected by vias 76 to the underlying areas 101 are formed in the first level, vertically in line with the ends of areas 101. In the example of FIGS. 6A and 6B, areas 77 and 79 are arranged parallel to the branches of the triangle defined by areas 81, rather than perpendicularly (radially with respect to the center of the structure) as in the previous drawings. Both embodiments are however possible.

An advantage of the embodiment of FIGS. 6A and 6B is that it decreases the capacitive coupling between the power conductors (drain, source for MOS transistors or emitter, collector for bipolar or IGBT transistors) and the control circuits of the gates of the controlled switches.

Another advantage is that the surface area of the central area is increased, which enables to decrease the mesh inductance.

Another advantage is that this takes part in decreasing common-mode emissions due to capacitive couplings between the potentials of terminals 11 and 12 and the ground in the case of an insulated metal substrate directly cooled by a heat sink.

Figure 8A:
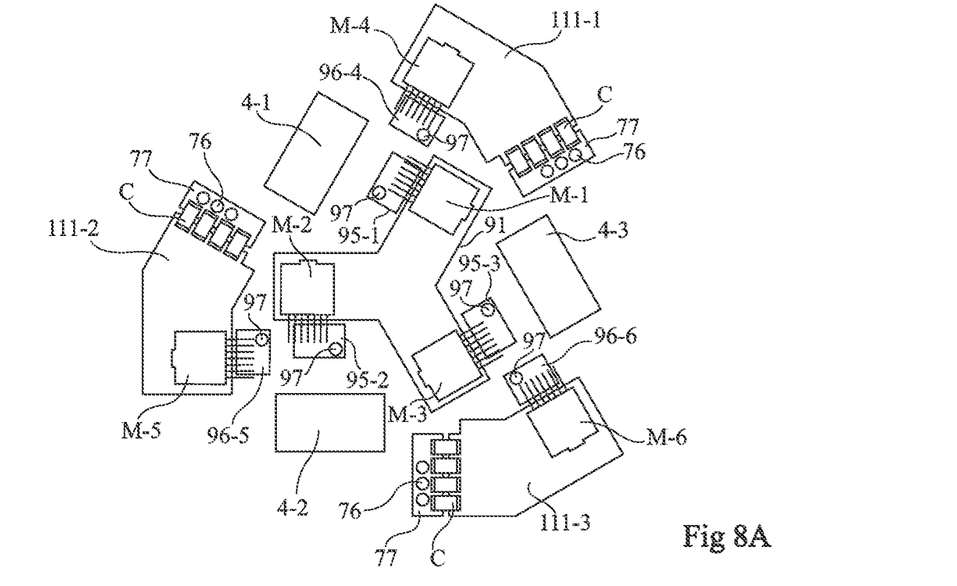
FIG. 8A very schematically shows another embodiment of a first level of a four-level insulated metal substrate having a three-phase current inverter unit formed therein.
Figure 8B:
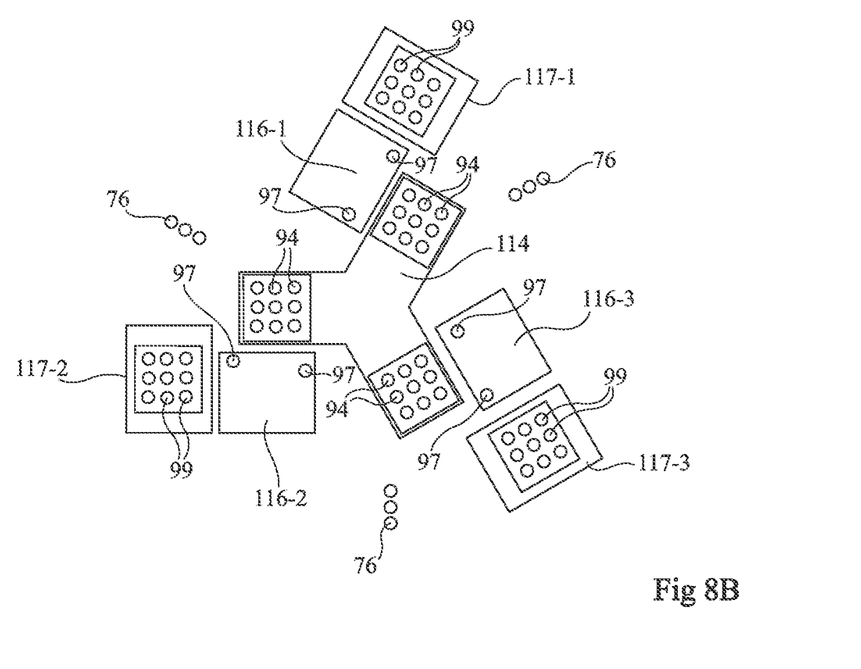
FIG. 8B very schematically shows another embodiment of a third level of the four-level insulated metal substrate having a three-phase current inverter unit according to FIG. 8A formed therein.
Figure 8C:
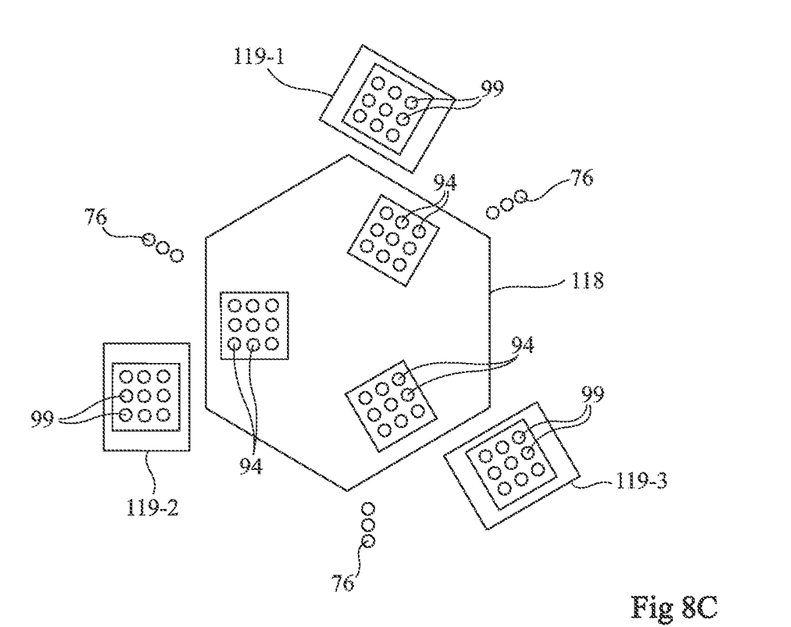
FIG. 8C very schematically shows another embodiment of a fourth level of the four-level insulated metal substrate having a three-phase current inverter unit according to FIG. 8A formed therein.
Figure 8D:
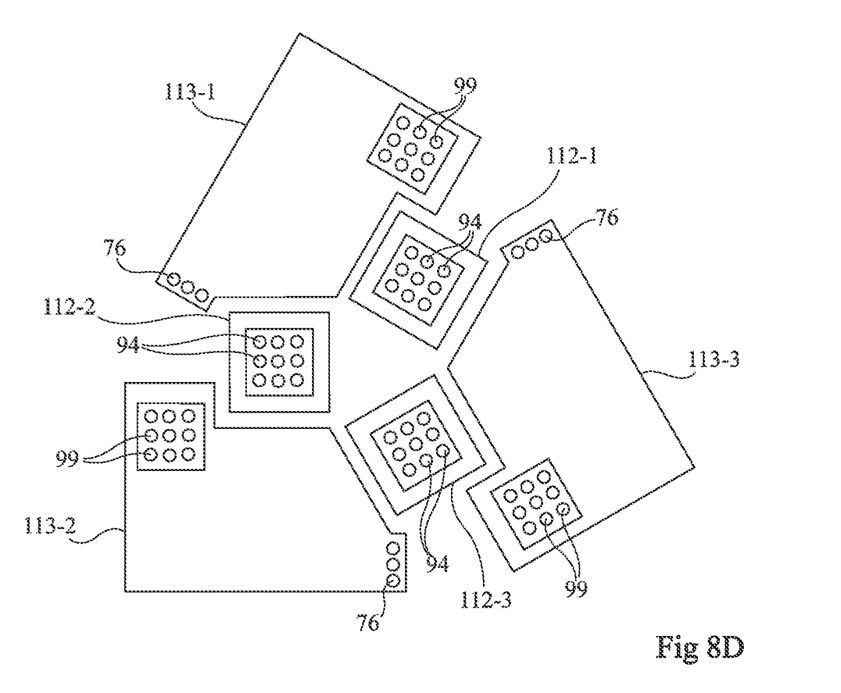
FIG. 8D very schematically shows another embodiment of a second level of the four-level insulated metal substrate having a three-phase current inverter unit according to FIG. 8A formed therein.

FIGS. 8A, 8B, 8C and 8D schematically show an embodiment of a unit of a three-phase current inverter on a four-level insulated metal substrate. FIG. 8A shows the first (upper) level. FIG. 8D shows the second (lower) level. FIGS. 8B and 8C show two intermediate levels, arbitrarily called third and fourth levels.

The first level of FIG. 8A is similar to that of FIG. 6A. The only difference is that the areas, here designated as 11$l$-1, 11$l$-2, 11$l$-3, supporting transistors M-4, M-5 and M-6 extend towards area 77 of the neighboring cell to receive a first electrode of capacitors C, the other electrode being received by area 111. In the example of FIG. 8A, areas 77 are radial at the center of the structure.

The second level (FIG. 8D) corresponding to the back side comprises at its center three second independent conductive areas 112-1, 112-2, 112-3 vertically in line with transistors M-1, M-2, M-3. These areas are connected by vias 94 to area 91 under transistors M-1, M-2, M-3 (by crossing the intermediate level(s)). The second level further comprises three first areas 113-1, 113-2, 113-3 respectively connecting, like areas 101 of FIG. 6B, the back side of each chip of transistor M-4, M-5, M-6 to area 77 of the neighboring cell (by vias 76). It should be noted that areas 112 may be omitted. Their function mainly is to favor the thermal connection with a heat sink provided at the back side of the general structure.

The third level (FIG. 8B) located just under the first level comprises a central conductive area 114 identical to area 91 of the first level, having vias 94 running therethrough. This level also comprises three conductive areas 116-1, 116-2, 116-3 of the type of areas 103 of FIG. 6B, connecting by means of vias 97 conductive areas 95 and 96 of the first level of each cell. The function of areas 116 is to form a protection plane under control circuits 4-1, 4-2, 4-3. Further, conductive areas 117-1, 117-2, 117-3 are provided vertically in line with transistors M-4, M-5, M-6 having vias 99 running therethrough. A function of the third level is to create conductive protection planes under control circuits 4.

The fourth level (FIG. 8C), located between the third and second levels, comprises a central area 118, for example, of hexagonal shape, having vias 94 running therethrough. This level further comprises areas 119-1, 119-2, 119-3 having vias 99 running therethrough. The function of area 118 is to decrease the parasitic inductance due to the connections. As a variation, area 118 may have a triangular shape integrating the regions of vias 94.

A layout of the chips such as illustrated in the above embodiments has the advantage of homogenizing the electrical and thermal behavior of the different current flow meshes. Indeed, the geometric symmetry between the different cells results in that the three possible meshes 3$h$-1/3$h$-2, 3$h$-2/3$h$-3, and 3$h$-1/3$h$-3 for high unit 2$h$ and the three possible meshes 3$l$-1/3$l$-2, 3$l$-2/3$l$-3, and 3$l$-1/3$l$-3 for low unit 2$l$ have a same electrical behavior. In particular, the impedances of the different switching meshes used are identical and the overvoltage levels seen by the different switches are identical. Further, their thermal behavior is also homogenized due to this geometric symmetry.

Other shapes may be provided for the metal areas of the insulated metal substrate receiving the switching cells, provided to respect, in each level of the insulated metal substrate, a symmetry of revolution of order 3, that is, a shift by approximately 120 degrees, preferably exactly 120 degrees, from one cell to the other around the center of the plane containing the unit.

An advantage of the embodiments which have been described is that it is now possible to form a three-phase current inverter where the electrical and thermal behavior of the different switching meshes is identical.

Various embodiments and variations have been described. Certain embodiments and variations may be combined and other variations and modifications which will occur to those skilled in the art. In particular, the metal areas of the substrate used are of course separated from one another to be electrically insulated. Further, these areas may be connected by conductive tracks or wires to other metal regions of the substrate, particularly to connect the inverter to upstream and downstream circuits. Further, although reference has been more specifically made to the use of an insulated metal substrate, the substrate having the components assembled thereon may be any other adapted substrate, for example, a printed circuit, a direct bond copper substrate, etc. Further, each switch may be in fact formed of a plurality of switches in parallel. The selection of the dimensions and of the number of chips to be assembled in parallel to form each switch of an inverter depends on the application and, among others, on the desired operation power.

Further, although the embodiments have been described in relation with examples applied to cells formed of a MOS transistor in series with a diode or of two series-connected MOS transistors, they can be transposed to other structures of three-phase switching cells, forming or not a switch which is bidirectional in terms of voltage and unidirectional or bidirectional in terms of current, where similar problems are posed.

It should be noted that the two units of a same three-phase current inverter are not necessarily paired on a same insulated metal substrate (in a same plane) but may be stacked with an interposed insulator, by connecting terminals 15, 16, and 17 by means of vias.

Finally, the practical implementation of the embodiments and variations which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A three-phase switching unit including three identical switching cells, each comprising a first switch and a second switch electrically in series, comprising a substrate having:
   a first level receiving, on conductive areas, back sides of integrated circuits forming said first switch and said second switch; and
   at least one second level comprising conductive areas of interconnection of vias between their first and second levels,
   the conductive areas of the different levels respecting a symmetry of revolution of order 3,
   wherein the first level comprises:
   three first conductive areas of reception of a back-side conduction terminal of at least one first switch of each cell;
   three second conductive areas of reception of wires of connection to a front-side conduction terminal of said first switch;
   a third central conductive area of reception of a back-side conduction terminal of the second switches of the three cells; and
   three fourth conductive areas of reception of wires of connection to a back-side conduction terminal of said second switches.

2. The unit of claim 1, wherein the second level comprises:
   three first conductive areas respectively vertically in line with the first switches; and
   at least one second conductive area vertically in line with the second switches.

3. The unit of claim 1, wherein the second level further comprises three third conductive areas, each connected by vias to a second and to a fourth conductive area of the first level.

4. The unit of claim 1, wherein said third conductive area of the first level is Y-shaped, each branch receiving one of said second switches.

5. The unit of claim 1, contained within a triangular shape.

6. The unit of claim 1, having a third level of its substrate, between the first and second levels, comprising:
   first conductive areas vertically in line with each first switch; and
   a second conductive area extending under the three second switches.

7. The unit of claim 6, having a fourth level of its substrate between the second and third levels, comprising:
   first conductive areas vertically in line with each first switch; and
   a second conductive area extending under the three second switches.

8. The unit of claim 1, wherein said first switch and said second switch are MOS transistors.

9. The unit of claim 1, wherein the substrate is a multilevel insulated metal substrate, preferably on ceramic.

10. The unit of claim 1, wherein the substrate is a multilevel printed circuit.

11. A three-phase current inverter, comprising two units of claim 1.

12. The inverter of claim 11, wherein the cells of the two units are electrically connected two by two, the interconnection nodes defining three phase terminals.

13. A three-phase switching unit including three identical switching cells, each comprising a first switch and a second switch electrically in series, comprising a substrate having:
   a first level receiving, on conductive areas, back sides of integrated circuits forming said first switch and said second switch; and
   at least one second level comprising conductive areas of interconnection of vias between their first and second levels,
   the conductive areas of the different levels respecting a symmetry of revolution of order 3,
   wherein the first level comprises:
   three first conductive areas of reception of a back-side conduction terminal of at least one first switch of each cell;
   three second conductive areas of reception of wires of connection to a front-side conduction terminal of said first switch, and wherein the first conductive areas of the first level receive respective conduction terminals of the second switches, the first level further comprising three third conductive areas of reception of wires of connection to respective front-side conduction terminals of the second switches.

14. The unit of claim 13 or claim 2, wherein the second conductive areas of the first level are each connected, by vias, to one of said first conductive areas of the second level.

15. The unit of claim 13, wherein said first conductive areas of the second level form a hexagonal ring.

16. The unit of claim 13, contained within a hexagonal shape.

* * * * *